United States Patent
Lee et al.

(10) Patent No.: US 9,853,652 B2
(45) Date of Patent: Dec. 26, 2017

(54) SEMICONDUCTOR DEVICE PERFORMING COMMON MODE VOLTAGE COMPENSATION USING ANALOG-TO-DIGITAL CONVERTER

(71) Applicant: Samsung Electronics Co., Ltd., Gyeonggi-do (KR)

(72) Inventors: Jong-Woo Lee, Seoul (KR); Thomas Byung-Hak Cho, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 15/214,125

(22) Filed: Jul. 19, 2016

(65) Prior Publication Data
US 2017/0026051 A1    Jan. 26, 2017

(30) Foreign Application Priority Data

Jul. 22, 2015  (KR) .................. 10-2015-0103869
Sep. 17, 2015  (KR) .................. 10-2015-0131414

(51) Int. Cl.
*H03M 1/10*   (2006.01)
*H03M 1/06*   (2006.01)
*H03M 1/38*   (2006.01)

(52) U.S. Cl.
CPC .............. *H03M 1/06* (2013.01); *H03M 1/38* (2013.01)

(58) Field of Classification Search
CPC .. H03M 1/12; H03M 2201/192; H03M 1/002; H03M 1/70; H03M 1/0845
USPC .................. 341/118, 120, 139, 142, 155
See application file for complete search history.

(56) References Cited

U.S. PATENT DOCUMENTS

| | | | |
|---|---|---|---|
| 6,081,214 A | 6/2000 | Morisson et al. | |
| 7,808,412 B2* | 10/2010 | Fukuzawa | H03G 5/24 341/118 |
| 7,973,694 B2* | 7/2011 | Koyama | H03K 7/06 341/155 |
| 8,094,056 B2 | 1/2012 | Nazemi et al. | |
| 8,417,202 B1 | 4/2013 | Fong et al. | |
| 8,421,541 B2 | 4/2013 | Sengupta et al. | |
| 8,502,714 B2 | 8/2013 | Chen et al. | |
| 8,525,713 B2* | 9/2013 | Wang | H03M 1/508 341/118 |
| 8,537,912 B2* | 9/2013 | Long | H04L 25/14 341/173 |
| 8,711,020 B2 | 4/2014 | Wulff et al. | |
| 9,059,779 B2* | 6/2015 | Li | H04B 1/40 |
| 9,397,679 B1* | 7/2016 | Harpe | H03M 1/1033 |
| 9,397,680 B2* | 7/2016 | Xu | H03M 1/1023 |

(Continued)

*Primary Examiner* — Linh Nguyen
(74) *Attorney, Agent, or Firm* — The Farrell Law Firm, P.C.

(57) ABSTRACT

A semiconductor device is provided that includes a first chip that generates a single signal by connecting a first signal line and a second signal line, to which differential signals are respectively provided, and outputs the single signal to a third signal line. The first chip is driven by a first power supply voltage. The semiconductor device also includes a second chip comprising an analog-to-digital converter (ADC) that receives the single signal through the third signal line, compares the single signal with a reference voltage, and outputs a digital signal based on the comparison. The semiconductor device also includes a controller that monitors the digital signal and adjusts the reference voltage to be approximately equivalent to the first power supply voltage.

17 Claims, 11 Drawing Sheets

(56) References Cited

U.S. PATENT DOCUMENTS

| | | | |
|---|---|---|---|
| 2005/0052307 A1* | 3/2005 | Nakano | G11C 29/02 341/155 |
| 2005/0190093 A1* | 9/2005 | Mayer | H03M 3/32 341/155 |
| 2008/0007443 A1* | 1/2008 | Inose | H03F 1/34 341/158 |
| 2008/0150771 A1* | 6/2008 | Inagaki | H03M 1/182 341/118 |
| 2010/0103015 A1* | 4/2010 | Yoshida | H03F 3/387 341/143 |
| 2014/0218223 A1* | 8/2014 | Darshan | H03M 3/474 341/143 |
| 2015/0244389 A1* | 8/2015 | Lim | H03M 1/345 341/164 |
| 2015/0244393 A1* | 8/2015 | Kabir | H03M 3/488 341/143 |

\* cited by examiner

SEMICONDUCTOR DEVICE PERFORMING COMMON MODE VOLTAGE COMPENSATION USING ANALOG-TO-DIGITAL CONVERTER

This application claims priority under 35 U.S.C. §119(a) to Korean Patent Application No. 10-2015-0103869 filed in the Korean Intellectual Property Office (KIPO) on Jul. 22, 2015 and Korean Patent Application No. 10-2015-0131414 filed in the KIPO on Sep. 17, 2015, the disclosures of which are incorporated herein by reference in their entirety.

BACKGROUND

1. Technical Field

The present disclosure relates generally to a semiconductor device, and more particularly, to a semiconductor device of a reduced size that performs common mode voltage compensation using an analog-to-digital converter (ADC).

2. Description of the Related Art

As the size of semiconductor devices generally becomes smaller, research has also been conducted to reduce the physical size of semiconductor packages, which include a semiconductor element.

SUMMARY

An aspect of the present disclosure provides a semiconductor device that has a reduced size due to a reduced number of terminals (e.g., balls) of a semiconductor package (or a semiconductor chip).

According to an aspect of the present disclosure, a semiconductor device is provided that includes a first chip that generates a single signal by connecting a first signal line and a second signal line, to which differential signals are respectively provided, and outputs the single signal to a third signal line. The first chip is driven by a first power supply voltage. The semiconductor device also includes a second chip comprising an analog-to-digital converter (ADC) that receives the single signal through the third signal line, compares the single signal with a reference voltage, and outputs a digital signal based on the comparison. The semiconductor device also includes a controller that monitors the digital signal and adjusts the reference voltage to be approximately equivalent to the first power supply voltage.

According to another aspect of the present disclosure, a semiconductor device is provided that includes a common mode voltage generator that receives differential signals and outputs a common mode voltage from the differential signals. The semiconductor device also includes an ADC that receives the common mode voltage from the common mode voltage generator, compares the common mode voltage with a reference voltage, and outputs a digital signal based on the comparison. The semiconductor device also includes a controller that monitors the digital signal and adjusts at least one of the reference voltage and the common mode voltage based on the digital signal.

According to another aspect of the present disclosure, a semiconductor device is provided that includes a first chip that generates a single signal from differential signals, and outputs the single signal. The semiconductor device also includes a second chip that receives the single signal, generates a digital signal based on a comparison of the single signal with a reference voltage, determines whether the digital signal is within a predefined range, adjusts the reference voltage when the digital signal is outside of the predefined range, and performs an analog-to-digital conversion operation when the digital signal is within the predefined range.

BRIEF DESCRIPTION OF THE DRAWINGS

The above and other aspects, features and advantages of the present disclosure will become more apparent from the following detailed description when taken in conjunction with the accompanying drawings, in which.

DETAILED DESCRIPTION OF EMBODIMENTS OF THE PRESENT DISCLOSURE

Embodiments of the present disclosure are described detail with reference to the accompanying drawings. The same or similar components may be designated by the same or similar reference numerals although they are illustrated in different drawings. Detailed descriptions of constructions or processes knowing the art may be omitted to avoid obscuring the subject matter of the present disclosure.

The use of the terms "a", "an", "the", and similar referents in the context of describing the present disclosure are to be construed to cover both the singular and the plural, unless otherwise indicated herein or clearly contradicted by context. The terms "comprising", "having", "including", and "containing" are to be construed as open-ended terms (i.e., meaning "including, but not limited to") unless otherwise noted.

Unless defined otherwise, all technical and scientific terms used herein have the same meanings as those commonly understood by one of ordinary skill in the art to which this present disclosure belongs. It is noted that the use of any and all examples, or exemplary terms, provided herein is intended merely to better illuminate the present disclosure, and is not intended to be a limitation on the scope of the present disclosure unless otherwise specified. Further, unless defined otherwise, all terms defined in generally used dictionaries may not be overly interpreted.

Embodiments of the present disclosure are described with reference to perspective views, cross-sectional views, and/or plan views. Thus, the profile of an exemplary view may be modified according to manufacturing techniques and/or allowances. That is, the embodiments of the present disclosure are not intended to limit the scope of the present disclosure, but instead, cover all changes and modifications that can be caused due to a change in a manufacturing process. Thus, regions shown in the drawings are illustrated in schematic form, and the shapes of the regions are presented simply by way of illustration, and not as a limitation.

Figure 1A:
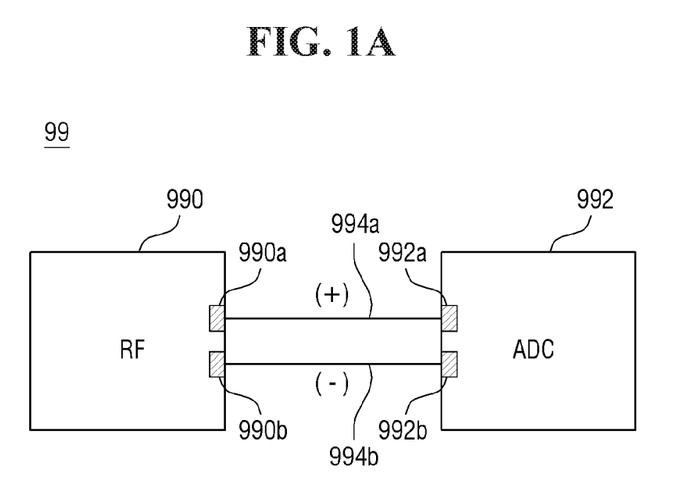
FIG. 1A is a block diagram of a semiconductor device including chips that communicate with each other using differential signals.

FIG. 1A is a block diagram of a semiconductor device including chips which communicate with each other using differential signals.

Referring to FIG. 1A, a semiconductor device 99 includes a first chip 990 and a second chip 992. The first chip 990 and second chip 992 may be separated from each other, as illustrated in FIG. 1A.

The first chip 990 is a radio frequency (RF) chip that receives a radio signal from an external source, and the second chip 992 is an analog-to-digital converter (ADC) chip that converts an analog signal received from the RF chip into a digital signal.

The first chip 990 and the second chip 992 are electrically connected to each other by a first signal line 994a and a second signal line 994b. That is, the first chip 990 and the second chip 992 may exchange signals with each other through the first signal line 994a and the second signal line 994b.

For example, differential signals may be provided to the first signal line 994a and the second signal line 994b. That is, when a signal having a positive polarity (+) is provided to the first signal line 994a, a signal having a negative polarity (−) is provided to the second signal line 994b.

To communicate with each other using the differential signals, each of the first and second chips 990 and 992 include at least two terminals. Specifically, the first chip 990 includes a first terminal 990a connected to the first signal line 994a and a second terminal 990b connected to the second signal line 994b. The second chip 992 includes a first terminal 992a connected to the first signal line 994a and a second terminal 992b connected to the second signal line 994b.

To reduce the size of the semiconductor device 99, the sizes of the first and second chips 990 and 992 should be reduced. If the first and second chips 990 and 992 of FIG. 1A are connected by a single-ended interface, the number of terminals of the first and second chips 990 and 992 can be reduced. That is, the sizes of the first and second chips 990 and 992 can be physically reduced.

However, if the first and second chips 990 and 992 are connected to each other by the single-ended interface, they cannot communicate with each other using differential signals, as shown in the semiconductor device 99 of FIG. 1A. Instead, the first and second chips 990 and 992 should communicate with each other using a single signal. Here, the single signal refers to a signal generated by performing an operation on differential signals or combining the differential signals using a predetermined method.

When the first chip 990 and the second chip 992 communicate with each other using the single signal, a common mode voltage needs to be compensated in order to secure the reliability of signal processing, as described in greater detail below with reference to FIG. 1B.

Figure 1B:
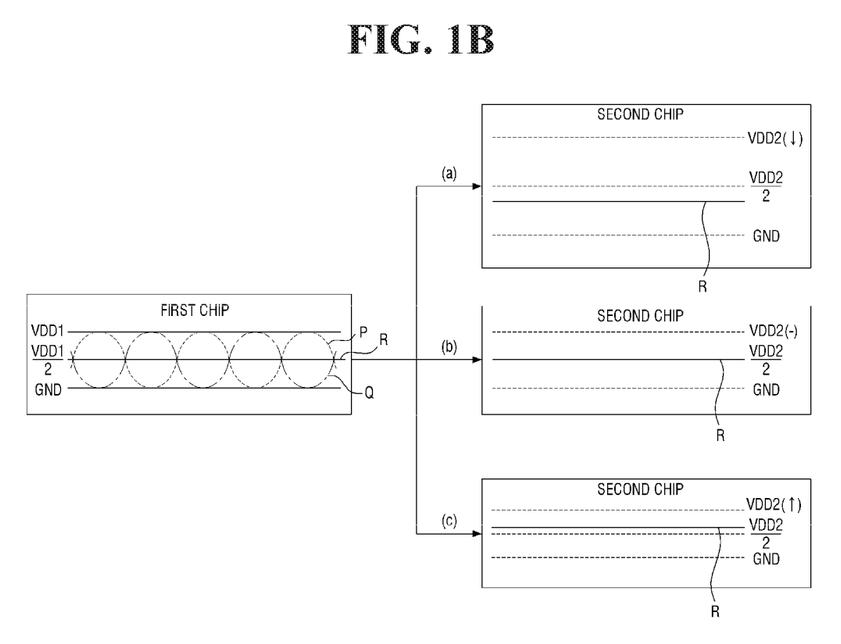
FIG. 1B is a conceptual diagram illustrating a voltage compensation method that is used when two chips are connected by a single-ended interface.

FIG. 1B is a conceptual diagram illustrating a voltage compensation method used when two chips are connected by a single-ended interface.

In FIG. 1B, a first chip driven by a first power supply voltage VDD1 generates a single signal R by causing a first differential signal P and a second differential signal Q to short-circuit. The first chip provides the generated single signal R to a second chip driven by a second power supply voltage VDD2. However, a method of generating the single signal R from the first differential signal P and the second differential signal Q is not limited to the above method, and various other methods may be used to generate the single signal R.

Ideally, if the first power supply voltage VDD1 and the second power supply voltage VDD2 are equal, the single signal R is interpreted by the second chip as shown in (b) of FIG. 1B. That is, a common mode voltage VDD1/2 of the first chip is recognized as being at the same level as a common mode voltage VDD2/2 of the second chip. Accordingly, regardless of whether the first chip outputs a signal having a voltage higher than the common mode voltage VDD1/2 or a signal having a voltage lower than the common mode voltage VDD1/2, the second chip can accurately interpret the signal.

If the second power supply voltage VDD2 is greater than the first power supply voltage VDD1, the single signal R is interpreted by the second chip as shown in (a) of FIG. 1B. That is, the common mode voltage VDD2/2 of the second chip is recognized as being at a higher level than the common mode voltage VDD1/2 of the first chip. Accordingly, regardless of whether the first chip outputs a signal having a voltage higher than the common mode voltage VDD1/2 or a signal having a voltage lower than the common mode voltage VDD1/2, the second chip may interpret the signal as being at a level lower than the common mode voltage VDD2/2. In this case, a voltage level of the second power supply voltage VDD2 of the second chip should be lowered until the common mode voltage VDD1/2 of the first chip is recognized as being at the same level as the common mode voltage VDD2/2 of the second chip.

If the second power supply voltage VDD2 is less than the first power supply voltage VDD1, the single signal R is interpreted by the second chip as shown in (c) of FIG. 1B. That is, the common mode voltage VDD2/2 of the second chip is recognized as being at a lower level than the common mode voltage VDD1/2 of the first chip. Accordingly, regardless of whether the first chip outputs a signal having a voltage higher than the common mode voltage VDD1/2 or a signal having a voltage lower than the common mode voltage VDD1/2, the second chip may interpret the signal as being at a level higher than the common mode voltage VDD2/2. In this case, the voltage level of the second power supply voltage VDD2 of the second chip should be increased until the common mode voltage VDD1/2 of the first chip is recognized as being at the same level as the common mode voltage VDD2/2 of the second chip.

Hereinafter, semiconductor devices are described that are reduced in size and can easily perform common mode voltage compensation.

Figure 2:
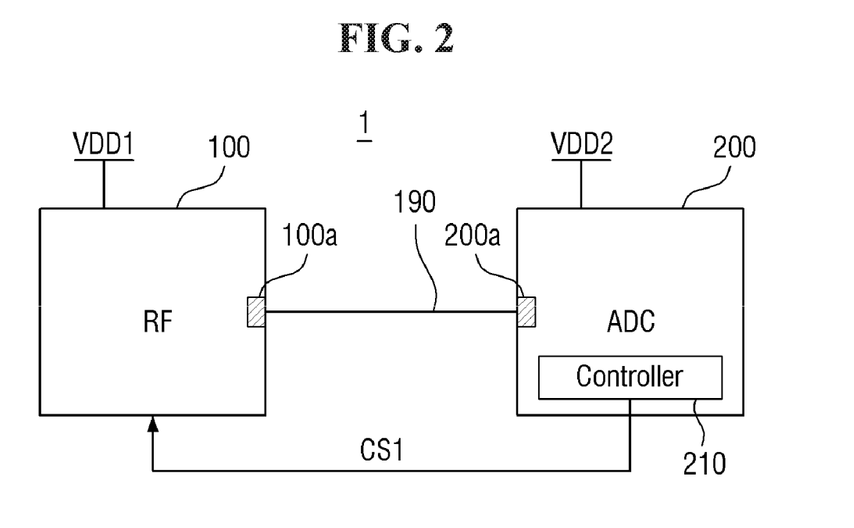
FIG. 2 is a block diagram of a semiconductor device, according to an embodiment of the present disclosure.
Figure 3:
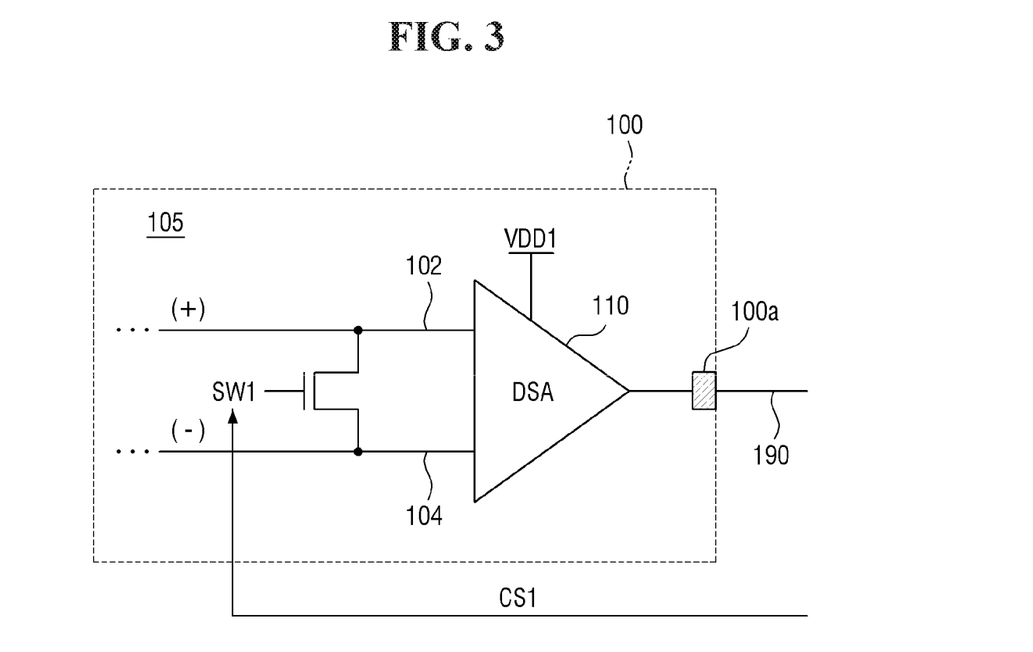
FIG. 3 is a partial circuit diagram of a first chip illustrated in FIG. 2, according to an embodiment of the present disclosure.
Figure 4:
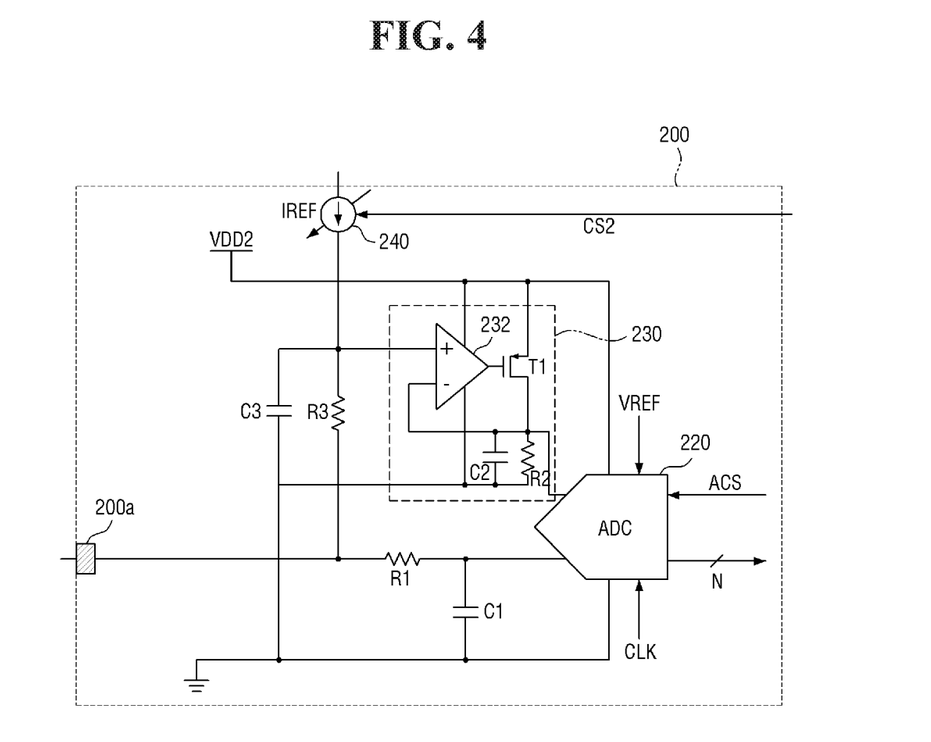
FIG. 4 is a partial circuit diagram of a second chip illustrated in FIG. 2, according to an embodiment of the present disclosure.

FIG. 2 is a block diagram of a semiconductor device, according to an embodiment of the present disclosure. FIG. 3 is a partial circuit diagram of a first chip illustrated in FIG. 2, according to an embodiment of the present disclosure. FIG. 4 is a partial circuit diagram of a second chip illustrated in FIG. 2, according to an embodiment of the present disclosure.

Referring to FIG. 2, a semiconductor device 1 includes a first chip 100 and a second chip 200. The first chip 100 is driven by a first power supply voltage VDD1, and the second chip 200 is driven by a second power supply voltage VDD2. The first chip 100 and the second chip 200 may be separated from each other, as illustrated in FIG. 2.

The first chip 100 is an RF chip that receives a radio signal from an external source, and the second chip 200 is an ADC chip that converts an analog signal received from the RF chip into a digital signal. In some embodiments of the present disclosure, if the semiconductor device 1 is a modem, the first chip 100 may serve as a receiver of the modem, and the second chip 200 may serve as a signal processor of the modem. However, the technical spirit of the present disclosure is not limited thereto, and the types of the first chip 100 and the second chip 200 can be changed as desired.

The first chip 100 and the second chip 200 are electrically connected via a signal line 190. That is, the first chip 100 and the second chip 200 employ a single-ended interface in which signals are exchanged through the signal line 190, which is a single signal line.

For example, a single signal may be provided to the signal line 190. The single signal is generated by performing an operation on differential signals used in the first chip 100, or by combining the differential signals using a predetermined method. That is, the single signal may be a signal generated by performing an operation on differential signals that are used in the first chip 100 and have a positive polarity (+) and a negative polarity (−) (see FIG. 3), or may be generated by combining the differential signals using a predetermined method.

To communicate with each other using the single signal, each of the first and second chips 100 and 200 include a single terminal. Specifically, the first chip 100 includes a first terminal 100a connected to the signal line 190, and the second chip 200 includes a second terminal 200a connected to the signal line 190.

Since each of the first and second chips 100 and 200 of the semiconductor device 1 includes a smaller number of terminals (e.g., balls) than each of the first and second chips 990 and 992 of the semiconductor device 99 of FIG. 1A, the sizes of the first and second chips 100 and 200 can be reduced. Accordingly, the size of the semiconductor device 1, which includes the first and second chips 100 and 200, can also be reduced.

The semiconductor device 1 includes a controller 210 for common mode voltage compensation between the first chip 100 and the second chip 200. Although the controller 210 is disposed in the second chip 200 in FIG. 2 to improve compensation efficiency, the technical spirit of the present disclosure is not limited thereto. When necessary for higher compensation efficiency, the controller 210 can be separated from the first and second chips 100 and 200. Also, when necessary for higher compensation efficiency, the controller 210 can be placed in the first chip 100.

The controller 210 generates and outputs control signals for common mode voltage compensation between the first chip 100 and the second chip 200. For example, a first control signal CS1 is provided to the first chip 100, and a second control signal CS2 is used in the second chip 200 (see FIG. 4).

According to an embodiment of the present disclosure, the first control signal CS1 is provided to the first chip 100 through a communication line that does not use the first terminal 100a of the first chip 100 and the second terminal 200a of the second chip 200.

Referring to FIG. 3, the first chip 100 includes a common mode voltage generator 105. The common mode voltage generator 105 includes a switch SW1 and an amplifier 110.

Based on the first control signal CS1, the switch SW1 connects a first signal line 102, to which a differential signal having a positive polarity (+) is provided, and a second signal line 104, to which a differential signal having a negative polarity (−) is provided. Specifically, the switch SW1 may connect the first signal line 102 and the second signal line 104 when the first control signal CS1 is in a first state, and may not connect the first signal line 102 and the second signal line 104 when the first control signal CS1 is in a second state.

The switch SW1 may include a transistor that is gated by, for example, the first control signal CS1, however, the technical spirit of the present disclosure is not limited thereto.

The amplifier 110 may amplify signals received through the first signal line 102 and the second signal line 104, and output the amplified signals to the signal line 190. When the switch SW1 is turned on, the amplifier 110 may amplify a common mode voltage received through the first signal line 102 and the second signal line 104, and output the amplified common mode voltage to the signal line 190. When the switch SW1 is turned off, the amplifier 110 may convert differential signals received through the first signal line 102 and the second signal line 104 into a single signal, amplify the single signal, and output the amplified single signal to the signal line 190. According to an embodiment of the present disclosure, the amplifier 110 may include a differential-to-single amplifier.

An output of the amplifier 110 is provided to the signal line 190 through the first terminal 100a.

Referring to FIG. 4, the second chip 200 includes an ADC 220, a buffer circuit 230, and a variable current source 240.

Figure 6:
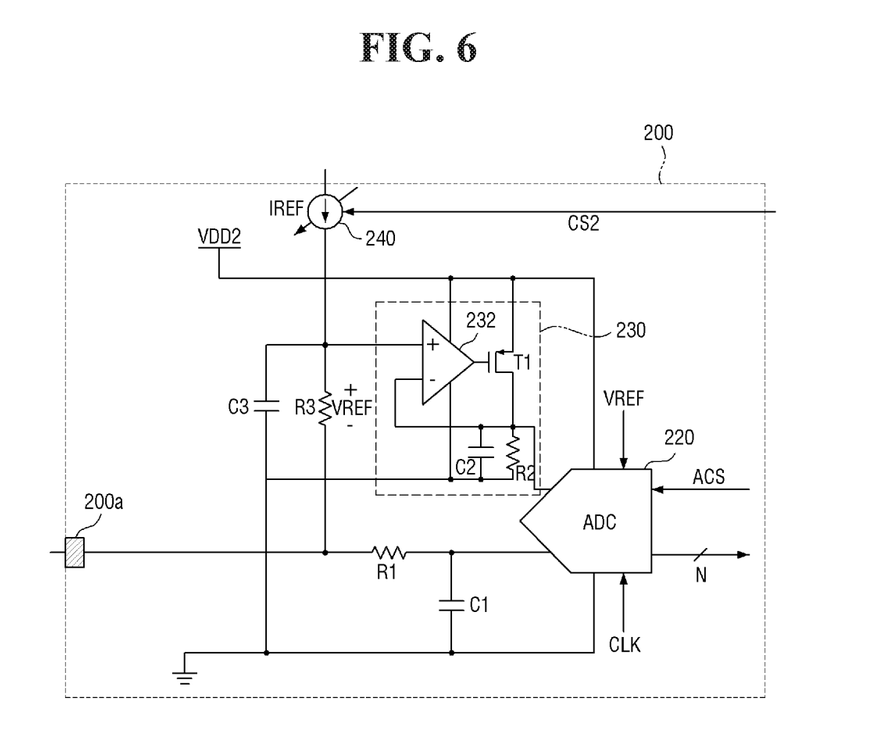
FIG. 6 is a diagram illustrating the operation of a semiconductor device, according to an embodiment of the present disclosure.

The ADC 220 outputs a digital signal N by comparing an output of the amplifier 100, received through the second terminal 200a connected to the signal line 190, with a reference voltage VREF generated by a reference resistor R3 (see FIG. 6). The reference voltage VREF may be proportional to the amount of current output from the variable current source 240. The digital signal N output from the ADC 220 may be provided to the controller 210.

The ADC 220 may operate in response to an operation control signal ACS. The operation control signal ACS may be provided from, for example, the controller 210. However, the technical spirit of the present disclosure is not limited thereto, and a circuit other than the controller 210 can also provide the operation control signal ACS to the ADC 220.

A resistor R1 and a capacitor C1 are disposed between the ADC 220 and the second terminal 200a. The resistor R1 is disposed in series between the ADC 220 and the second terminal 200a, and the capacitor C1 has one terminal connected to the ADC 220 and another terminal connected to a ground.

A capacitor C3 is connected in parallel with the reference resistor R3, and the variable current source 240 and the reference resistor R3 are connected in series.

According to an embodiment of the present disclosure, the ADC 220 may include, but is not limited to, a successive approximation register (SAR) ADC that compares data and determines bits of digital code by repeatedly performing analog-to-digital conversion.

The buffer circuit 230 may buffer the reference voltage VREF generated by the reference resistor R3, and provide the buffered reference voltage VREF to the ADC 220.

The buffer circuit 230 includes a comparator 232, which has a first input terminal connected to the reference resistor R3 and a second input terminal connected to the ADC 220, a transistor T1, which is gated by an output of the comparator 232, and a resistor R2 and a capacitor C2, which are connected to an input terminal and an output terminal of the comparator 232.

The variable current source 240 may adjust the amount of output current according to the second control signal CS2 received from the controller 210. Specifically, when the controller 210 provides the second control signal CS2 in a first state to the variable current source 240, by monitoring outputs of the ADC 220, the variable current source 240 may increase the amount of output current. In addition, when the controller 210 provides the second control signal CS2 in a second state to the variable current source 240, by monitoring outputs of the ADC 220, the variable current source 240 may reduce the amount of output current.

The operation of the semiconductor device 1 disclosure is described in greater detail below with reference to FIGS. 5 and 6.

Figure 5:
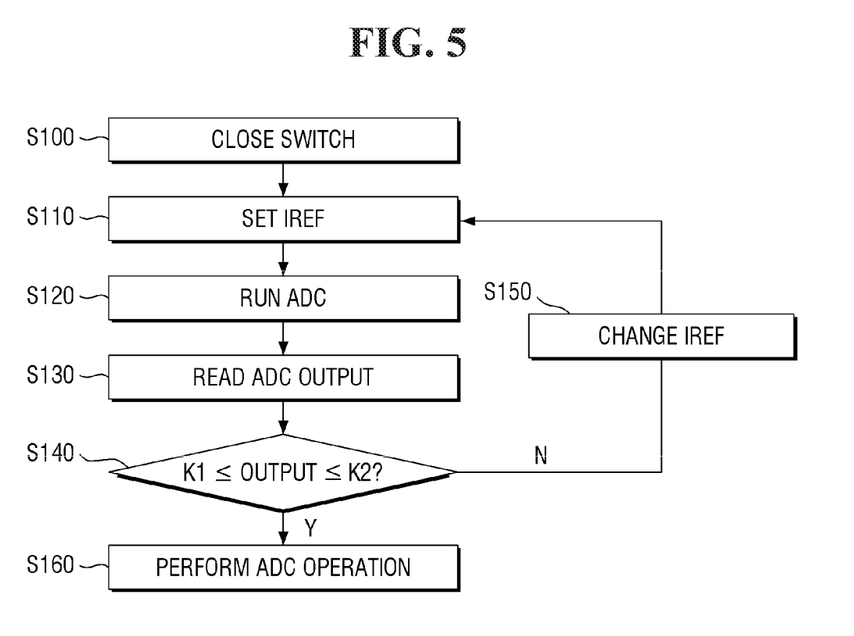
FIG. 5 is a flowchart illustrating the operation of a semiconductor device, according to an embodiment of the present disclosure.

FIG. 5 is a flowchart illustrating the operation of a semiconductor device, according to an embodiment of the present disclosure. FIG. 6 is a diagram illustrating the operation of a semiconductor device, according to an embodiment of the present disclosure.

Referring to FIG. 5, a switch is closed, in step S100. For example, the controller 210 transmits the first control signal CS1 in the first state to the switch SW1, thereby connecting the first signal line 102, to which a differential signal having a positive polarity (+) is provided, and the second signal line 104, to which a differential signal having a negative polarity (−) is provided.

Accordingly, a signal having a common mode voltage (e.g., R in FIG. 1B) is provided to the first signal line 102 and the second signal line 104. The amplifier 110 outputs the signal to the second chip 200 through the signal line 190.

Referring back to FIG. 5, an initial amount of current output from a variable current source is set, in step S110. As shown in FIG. 6, the controller 210 sets an initial amount of current output from the variable current source 240 by transmitting the second control signal CS in a third state to the variable current source 240.

An ADC is operated, in step S120 of FIG. 5. Referring to FIG. 6, the controller 210 provides the operation control signal ACS to the ADC 220. The ADC 220 outputs the digital signal N by comparing an output of the amplifier 110, which is provided to the signal line 190, with the reference voltage VREF generated by the reference resistor R3 according to the initial amount of current output from the variable current source 240.

Referring back to FIG. 5, an output of the ADC is read, in step S130, and it is determined whether the read output of the ADC is within a predetermined range (i.e., greater than or equal to a first value K1 and less than or equal to a second value K2), in step S140.

As shown in FIG. 6, the controller 210 determines whether the digital signal N, which generated by comparing the output of the amplifier 110h the reference voltage VREF, is within a predetermined range. That is, the controller 210 determines whether the digital signal N is greater than or equal to a first value K1 and less than or equal to a second value K2.

When potential values of the digital signal N are arranged sequentially from a smallest value to a largest value, the first value K1 and the second value K2 are located in the middle of these potential values.

For example, when the digital signal N is composed of two bits, and potential values of the digital signal N are arranged sequentially from a smallest value of 00 to a largest value of 11, i.e., in the order of 00, 01, 10 and 11, the first value K1 may be 01, and the second value K2 may be 10.

In another example, when the digital signal N is composed of three bits, and potential values of the digital signal N are arranged sequentially from a smallest value of 000 to a largest value of 111, i.e., in the order of 000, 001, 010, 011, 100, 101, 110 and 111, the first value K1 may be 011, and the second value K2 may be 100.

When the ADC 220 outputs the digital signal N composed of M bits (M is a natural number of four or greater), the first value K1 and the second value K2 may also be determined as described above.

Referring back to FIG. 5, when the read output of the ADC is outside the predetermined range (i.e., less than the first value K1 or greater than the second value K2), the amount of current output from the variable current source is changed, in step S150.

As shown in FIG. 6, a case where the digital signal N is less than the first value K1 corresponds to (a) of FIG. 1B. That is, although the first chip 100 outputs a signal having a common mode voltage (e.g., VDD1/2), the second chip 200 does not interpret the signal as a common mode voltage (e.g., VDD2/2) but interprets the signal as a voltage lower than the common mode voltage (e.g., VDD2/2). This phenomenon may occur when the reference voltage VREF generated by the reference resistor R3 is greater than the first power supply voltage VDD1.

Therefore, the controller 210 reduces the amount of current output from the variable current source 240 by providing the second control signal CS2 in the second state to the variable current source 240. When the amount of current output from the variable current source 240 is reduced, the magnitude of the reference voltage VREF generated by the reference resistor R3 is reduced.

A case where the digital signal N is greater than the second value K2 corresponds to (c) of FIG. 1B. That is, although the first chip 100 outputs a signal having the common mode voltage (e.g., VDD1/2), the second chip 200 does not interpret the signal as the common mode voltage (e.g., VDD2/2) but interprets the signal as a voltage higher than the common mode voltage (e.g., VDD2/2). This phenomenon may occur when the reference voltage VREF generated by the reference resistor R3 is smaller than the first power supply voltage VDD1.

Therefore, the controller 210 increases the amount of current output from the variable current source 240 by providing the second control signal CS2 in the first state to the variable current source 240. When the amount of current output from the variable current source 240 is increased, the magnitude of the reference voltage VREF generated by the reference resistor R3 is increased.

The controller 210 may repeat operations S110 through S140 until the digital signal N output from the ADC 220 is between the first value K1 and the second value K2.

Referring again to FIG. 5, when it is determined that the read output of the ADC is within the predetermined range, analog-to-digital conversion is performed, in step S160.

If the digital signal N output from the ADC 220 is greater than or equal to the first value K1 and less than or equal to the second value K2, as a result of repeating operations S110 through S150, the state of (b) of FIG. 1B is realized. That is, when the first chip 100 outputs a signal having the common mode voltage (e.g., VDD1/2), the second chip 200 interprets the signal as the common mode voltage (e.g., VDD2/2).

Therefore, the first chip 100 may output the signal through a single-ended interface (e.g., the signal line 190), and the ADC 220 included in the second chip 200 may receive the signal and perform analog-to-digital conversion on the signal.

The semiconductor device 1 can perform common mode voltage compensation using the ADC 220, and can be reduced in size by reducing the number of terminals included in each of the first chip 100 and the second chip 200.

Figure 7:
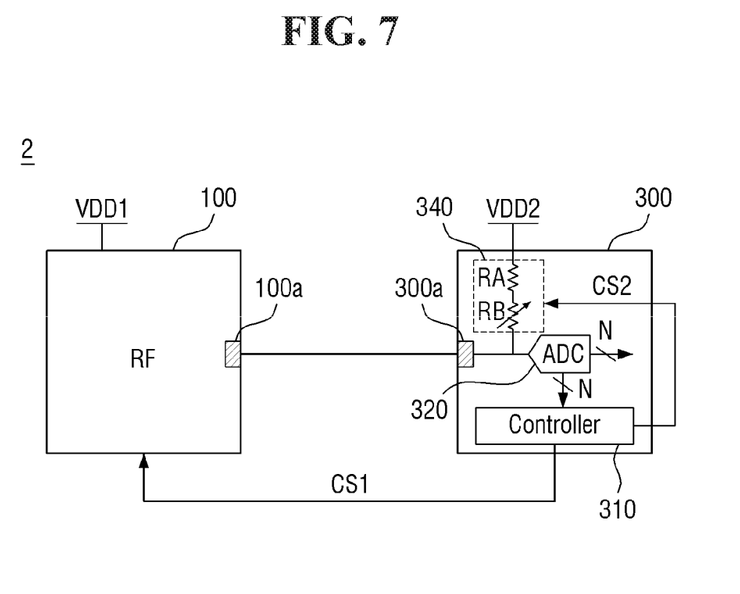
FIG. 7 is a block diagram of a semiconductor device, according to another embodiment of the present disclosure.

FIG. 7 is a block diagram illustrating a semiconductor device, according to an embodiment of the present disclosure.

Referring to FIG. 7, a semiconductor device 2 includes the first chip 100 and a second chip 300. The first chip 100 is driven by the first power supply voltage VDD1, and the second chip 300 is driven by the second power supply voltage VDD2. The first chip 100 and the second chip 300 are separated from each other, as illustrated in FIG. 7.

The first chip 100 converts differential signals into a single signal and outputs the single signal through the first terminal 100a. The second chip 300 receives the single signal through a second terminal 300a and sends the received single signal to an ADC 320. That is, the first chip 100 and the second chip 300 employ a single-ended interface in which signals are exchanged through a single signal line.

A controller 310 monitors a digital signal N output from the ADC 320 and generates and outputs control signals for common mode voltage compensation between the first chip 100 and the second chip 300. For example, a first control signal CS1 is provided to the first chip 100, and a second control signal CS2 is used in the second chip 300.

The second chip 300 includes a voltage divider 340. The voltage divider 340 includes a fixed resistor RA and a variable resistor RB. A resistance value of the fixed resistor RA is fixed, and a resistance value of the variable resistor RB varies according to the second control signal CS2 output from the controller 310.

A portion of the second power supply voltage VDD2, which is distributed to the variable resistor RB according to a ratio of the resistance values of the fixed resistor RA and the variable resistor RB, is provided to the ADC 320 as a reference voltage (e.g., VREF in FIG. 6).

Figure 8:
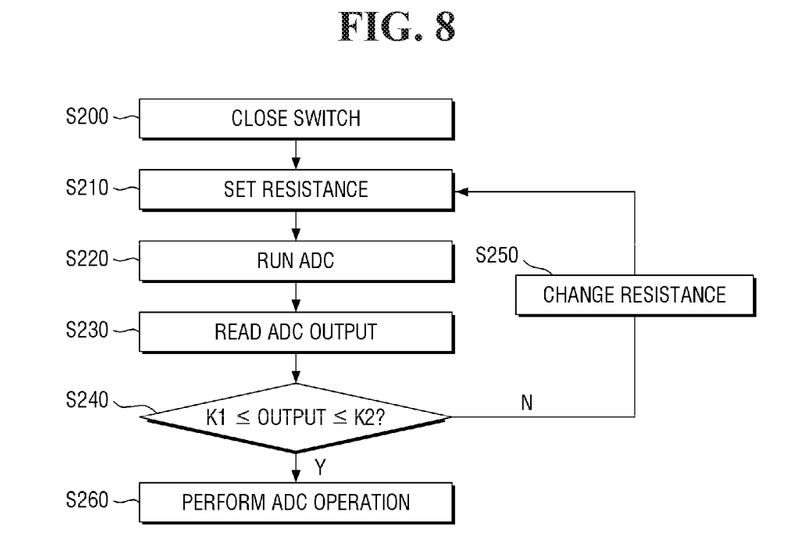
FIG. 8 is a flowchart illustrating the operation of a semiconductor device, according to another embodiment of the present disclosure.

FIG. 8 is a flowchart illustrating the operation of a semiconductor device, according to another embodiment of the present disclosure.

Referring to FIG. 8, a switch is closed, in step S200, which is described in detail above with respect to step S100 of FIG. 5.

An initial resistance value of a variable resistor is set, in step S120. For example, the controller 310 sets an initial resistance value of the variable resistor RB by transmitting the second control signal CS2 in a third state to the variable resistor RB.

The ADC is operated, in step S220. For example, the ADC 320 is controlled by the controller 310 to output the digital signal N by comparing an output of the first chip 100 with the reference voltage distributed according to the initial resistance value of the variable resistor RB.

An output of the ADC is read in step S230, and it is determined whether the read output of the ADC is within a predetermined range, in step S240, which is described in detail above with respect to step S140 of FIG. 5.

When the read output of the ADC is outside the predetermined range, the resistance value of the variable resistor is changed, in step S250.

If the digital signal N output from the ADC 320 is less than a first value K1, the controller 310 reduces the resistance value of the variable resistor RB by providing the second control signal CS2 in a second state to the variable resistor RB. When the resistance value of the variable resistor RB is reduced, the magnitude of a voltage distributed to the variable resistor RB is reduced. That is, the magnitude of the reference voltage is reduced.

If the digital signal N output from the ADC 320 is greater than the second value K2, the controller 310 increases the resistance value of the variable resistor RB by providing the second control signal CS2 in a first state to the variable resistor RB. When the resistance value of the variable resistor RB is increased, the magnitude of the voltage distributed to the variable resistor RB is increased. That is, the magnitude of the reference voltage is increased.

The controller 310 repeats operations S210 through 240 until the digital signal N output from the ADC 320 is greater than or equal to the first value K1 and less than or equal to the second value K2.

When it is determined that the read output of the ADC is within the predetermined range, analog-to-digital conversion is performed, in step S260.

Figure 9:
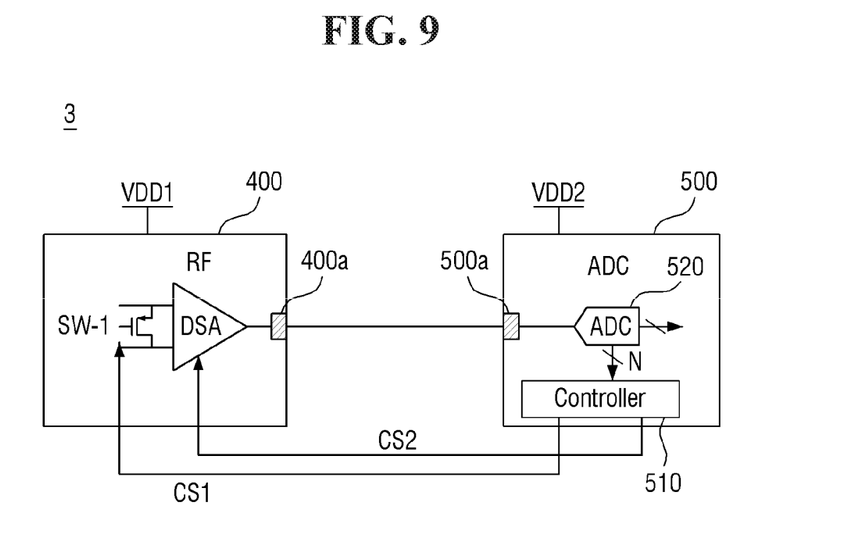
FIG. 9 is a block diagram of a semiconductor device, according to another embodiment of the present disclosure.

FIG. 9 is a block diagram illustrating a semiconductor device, according to another embodiment of the present disclosure.

Referring to FIG. 9, a semiconductor device 3 includes a first chip 400 and a second chip 500. The first chip 400 is driven by the first power supply voltage VDD1, and the second chip 500 is driven by the second power supply voltage VDD2. The first chip 400 and the second chip 500 are separated from each other, as illustrated in FIG. 9.

The first chip 400 converts differential signals into a single signal and outputs the single signal through a first terminal 400a. The second chip 500 receives the single signal through a second terminal 500a and sends the received single signal to an ADC 520. That is, the first chip 400 and the second chip 500 employ a single-ended interface in which signals are exchanged through a single signal line.

A controller 510 monitors a digital signal N output from the ADC 520, and generates and outputs control signals for common mode voltage compensation between the first chip 400 and the second chip 500. In the embodiment of FIG. 9, both the first control signal CS1 and the second control signal CS2 are output from the controller 510 and are provided to the first chip 400.

Specifically, the first control signal CS1 is used to determine on or off of the switch SW-1 included in the first chip 400, and the second control signal CS2 is used to control a gain of the amplifier DSA included in the first chip 400. In FIG. 9, the controller 510 is disposed in the second chip 500, however, the controller 510 can also be disposed in the first chip 400.

Figure 10:
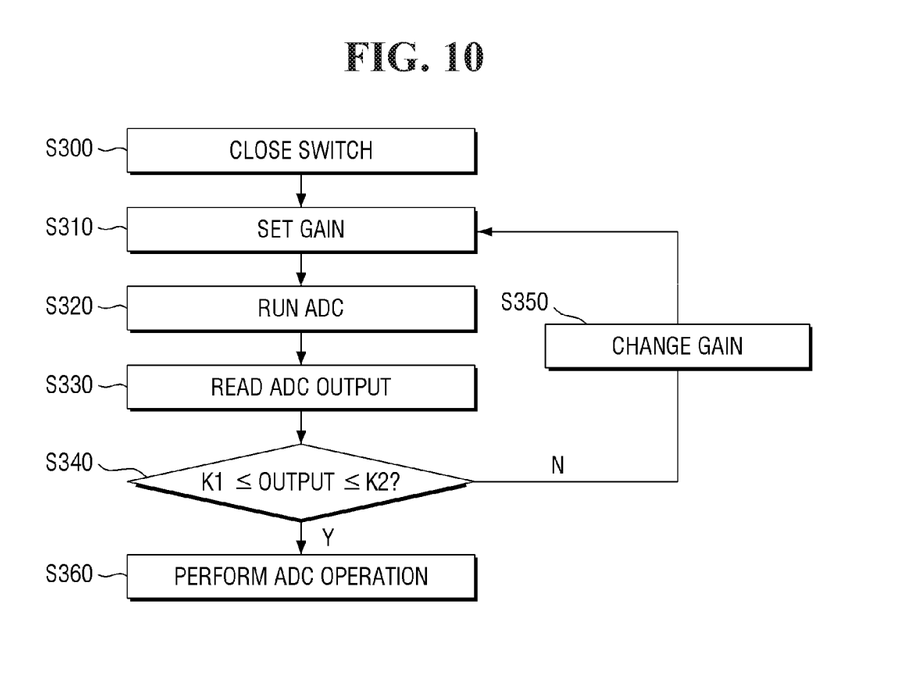
FIG. 10 is a flowchart illustrating the operation of the semiconductor device, according to another embodiment of the present disclosure.

FIG. 10 is a flowchart illustrating the operation of the semiconductor device, according to another embodiment of the present disclosure.

Referring to FIG. 10, a switch is closed, in step S300, which is described in detail above with reference to step S100 of FIG. 5.

An initial gain of an amplifier is set, in step S320. For example, the controller 510 sets an initial gain of the amplifier DSA by transmitting the second control signal CS2 in the third state to the amplifier DSA.

An ADC is operated, in step S320. For example, the ADC 520 is controlled by the controller 510 to output the digital signal N by comparing an output of the amplifier DSA of the first chip 400 with a reference voltage (e.g., VREF in FIG. 6) of the second chip 500. The reference voltage of the second chip 500 may be less than or equal to the second power supply voltage VDD2.

An output of the ADC is read, in step S330, and it is determined whether the read output of the ADC is within a predetermined range, in step S340, which is described in greater detail above with reference to step S140 of FIG. 5.

When the read output of the ADC is outside the predetermined range, the gain of the amplifier is changed, in step S350.

If the digital signal N output from the ADC 520 is less than the first value K1, the controller 510 increases the gain of the amplifier DSA by providing the second control signal CS2 in the second state to the amplifier DSA. When the gain of the amplifier is increased, a value of the digital signal N output from the ADC 520 is increased.

If the digital signal N output from the ADC 520 is greater than the second value K2, the controller 510 reduces the gain of the amplifier DSA by providing the second control signal CS2 in the first state to the amplifier DSA. When the gain of the amplifier DSA is reduced, the value of the digital signal N output from the ADC 520 is reduced.

The controller 510 repeats operations S310 through S340 until the digital signal N output from the ADC 320 is greater than or equal to the first value K1 and less than or equal to the second value K2.

When it is determined that the read output of the ADC is within the predetermined range, analog-to-digital conversion is performed, in step S360.

While the present disclosure has been shown and described with reference to certain embodiments thereof, it will be understood by those of skill in the art that various changes in form and detail may be made therein without departing from the spirit and scope of the present disclosure as defined by the following claims.

What is claimed is:

1. A semiconductor device comprising:
    a first chip that generates a single signal by connecting a first signal line and a second signal line to each other, to which differential signals are respectively provided, and outputs the single signal to a third signal line, the first chip being driven by a first power supply voltage;
    a second chip comprising an analog-to-digital converter (ADC) that receives the single signal through the third signal line, compares the single signal with a reference voltage, and outputs a digital signal based on the comparison; and
    a controller that monitors the digital signal and adjusts the reference voltage to be approximately equivalent to the first power supply voltage.

2. The semiconductor device of claim 1, wherein the second chip further comprises a variable current source, the reference voltage is proportional to an amount of current output from the variable current source, and the controller adjusts the amount of current output from the variable current source based on monitoring of the digital signal.

3. The semiconductor device of claim 1, wherein the second chip further comprises a voltage divider that comprises a variable resistor, the reference voltage is applied to the variable resistor from the second power supply voltage, and the controller adjusts a resistance value of the variable resistor based on monitoring of the digital signal.

4. The semiconductor device of claim 1, wherein the controller is disposed in the second chip.

5. The semiconductor device of claim 4, wherein the first chip comprises a switch that connects the first signal line and the second signal line in response to a first control signal, and the controller provides the first control signal to the switch and adjusts the reference voltage using a second control signal that is different from the first control signal.

6. The semiconductor device of claim 5, wherein the controller sets the reference voltage to a first voltage, closes the switch, and sets the reference voltage to a second voltage different from the first voltage when the digital signal is outside of a predetermined range.

7. The semiconductor device of claim 1, wherein the first chip comprises a radio frequency (RF) chip that receives an analog radio signal, and the second chip comprises an ADC chip that converts the analog radio signal into a digital signal.

8. The semiconductor device of claim 1, wherein the single signal comprises a common mode voltage of the differential signals.

9. A semiconductor device comprising:
    a common mode voltage generator that receives differential signals and outputs a common mode voltage from the differential signals;
    an ADC that receives the common mode voltage from the common mode voltage generator, compares the common mode voltage with a reference voltage, and outputs a digital signal based on the comparison; and
    a controller that monitors the digital signal and adjusts at least one of the reference voltage and the common mode voltage based on the digital signal,
    wherein the common mode voltage generator comprises a first signal line and a second signal line to which differential signals are respectively provided, and a switch that is controlled by the controller to connect the first signal line and the second signal line to each other.

10. The semiconductor device of claim 9, wherein the common mode voltage generator comprises an amplifier that amplifies the common mode voltage, and the controller adjusts a gain of the amplifier based on monitoring of the digital signal.

11. The semiconductor device of claim 9, wherein two or more of the common mode voltage generator, the ADC, and the controller are disposed in the same chip.

12. The semiconductor device of claim 9, wherein the controller sets the reference voltage to a first voltage before the common mode voltage generator outputs the common mode voltage, and sets the reference voltage to a second voltage that is different from the first voltage when the digital signal, which is output as a result of comparing the common mode voltage and the first voltage, is outside a predetermined range.

13. The semiconductor device of claim 9, wherein the common mode voltage generator is disposed in a first chip, and the ADC is disposed in a second chip that is separated from the first chip.

14. The semiconductor device of claim 13, wherein the common mode voltage is formed using a first power supply voltage provided to the first chip, and the reference voltage is formed using a second power supply voltage provided to the second chip.

15. A semiconductor device comprising:
    a first chip that generates a single signal from differential signals, and outputs the single signal;
    a second chip that receives the single signal, generates a digital signal based on a comparison of the single signal with a reference voltage, determines whether the digital signal is within a predefined range, adjusts the reference voltage when the digital signal is outside of the predefined range, and performs an analog-to-digital conversion operation when the digital signal is within the predefined range, wherein the second chip comprises a terminal, an analog-to-digital converter (ADC), and a controller, and wherein the first chip comprises a switch that is controlled by the controller to connect or disconnect respective lines of the differential signals to or from each other.

16. The semiconductor device of claim 15, wherein the second chip adjusts the reference voltage such that the digital signal is within the predefined range.

17. The semiconductor device of claim 15, wherein the predefined range is a range in a middle of potential values for the digital signal.

* * * * *